(12) United States Patent  (10) Patent No.: US 7,038,493 B2
Hsieh  (45) Date of Patent: May 2, 2006

(54) CIRCUIT FOR ELIMINATING LEAKAGE CURRENT IN SIGNAL TRANSMISSION

(75) Inventor: Ming Chih Hsieh, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 65 days.

(21) Appl. No.: 10/900,791

(22) Filed: Jul. 27, 2004

(65) Prior Publication Data

US 2005/0140392 A1  Jun. 30, 2005

(30) Foreign Application Priority Data

Dec. 26, 2003 (TW) ............................. 92137069 A

(51) Int. Cl.
*H03K 17/16* (2006.01)
*H03K 19/003* (2006.01)
*H03K 19/0175* (2006.01)
*H03K 19/00* (2006.01)

(52) U.S. Cl. .......................... 326/83; 326/26; 326/27; 326/82; 326/103

(58) Field of Classification Search .............. 326/82, 326/83, 26, 27, 102
See application file for complete search history.

(56) References Cited

U.S. PATENT DOCUMENTS

| 4,862,018 | A  | * | 8/1989  | Taylor et al. ................. 326/27 |
| 5,140,194 | A  | * | 8/1992  | Okitaka ....................... 326/86 |
| 6,323,701 | B1 | * | 11/2001 | Gradinariu et al. ......... 327/109 |
| 6,424,174 | B1 | * | 7/2002  | Nowak et al. ................ 326/81 |

FOREIGN PATENT DOCUMENTS

CN  1310502 A  8/2001

* cited by examiner

*Primary Examiner*—Rexford Barnie
*Assistant Examiner*—Jason Crawford
(74) *Attorney, Agent, or Firm*—Wei Te Chung

(57) ABSTRACT

A circuit (3) for eliminating leakage current in signals transmitted from a first electronic system (1) to a second electronic system (2) includes two circuit units. Each circuit unit comprises a field-effect transistor (Q1, Q2), a first resistor (R1, R3), a second resistor (R2, R4), and a VCC. A source of the field-effect transistor is connected to the first system, for receiving a signal accompanied by leakage current. A gate of the field-effect transistor is connected to the VCC via the first resistor. A drain of the field-effect transistor is connected to the VCC via the second resistor. The drain of the field-effect transistor is also connected to the second system. The field-effect transistor is configured such that leakage current is blocked thereat, and the signal is transmitted to the second system without the leakage current.

7 Claims, 2 Drawing Sheets

CIRCUIT FOR ELIMINATING LEAKAGE CURRENT IN SIGNAL TRANSMISSION

BACKGROUND OF THE INVENTION

1. Field of the Invention

The present invention relates to means for eliminating leakage current in electrical signals traveling through circuits, and particularly to a circuit for eliminating leakage current in a signal by use of a field-effect transistor.

2. Description of the Prior Art

Electric leakage is an endemic problem for designers of digital circuits. FIG. 1 is a schematic diagram of transmission of signals accompanied by electrical leakage. Leakage current exists in a first electronic system 1. The leakage current is transmitted with the signals to a second electronic system 2 via transmission lines. The leakage current causes noises in the signals. Furthermore, the leakage current may generate an electromagnetic field, and the generated electromagnetic field may interfere with proper operation of the second system 2.

In order to eliminate leakage current, one solution is to employ so-called designer integrated circuits (ICs). However, the cost of designer ICs is generally considerably high. Another solution is to use a common IC, such as a 7404-type IC, to isolate the leakage current from the signals. Nevertheless, in most cases, only very few signal lines need to be isolated. If an IC is employed to achieve isolation, the cost of the IC is still disproportionately high compared to the benefit derived by the handful of signal lines. Therefore, a simple and economical solution is needed for solving the problem of the leakage current in these circumstances.

SUMMARY OF THE INVENTION

An objective of the present invention is to provide a simple and economical circuit for eliminating leakage current in signal transmission.

In order to fulfill the above-mentioned objective, the present invention provides a circuit for eliminating leakage current in a signal that is transmitted from a first electronic system to a second electronic system. The circuit comprises two circuit units, each of which comprises a field-effect transistor, a first resistor, a second resistor, and a VCC. A source of the field-effect transistor is connected to the first electronic system, for receiving a signal accompanied by leakage current. A gate of the field-effect transistor is connected to the VCC via the first resistor. A drain of the field-effect transistor is connected to the VCC via the second resistor. The drain of the field-effect transistor is also connected to the second electronic system. The field-effect transistor is configured such that leakage current is blocked thereat, and the signal is transmitted to the second system without the leakage current.

Other objects, advantages and novel features of the present invention will become more apparent from the following detailed description when taken in conjunction with the accompanying drawings, in which:

DETAILED DESCRIPTION OF THE INVENTION

Figure 1:
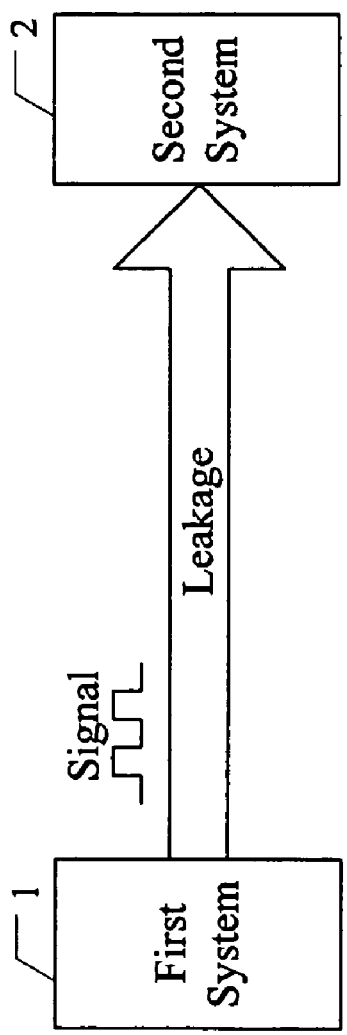
FIG. 1 is a schematic diagram of a typical electronic architecture in which transmission of signals is accompanied by electrical leakages.
Figure 2:
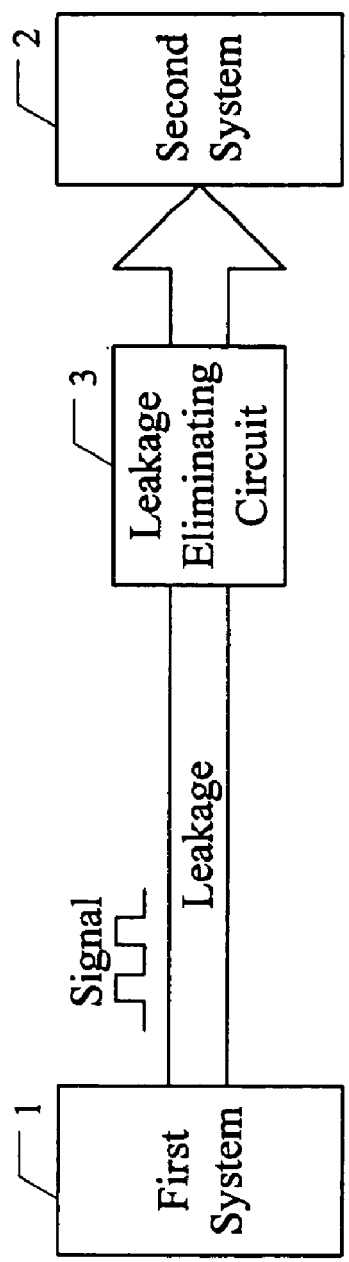
FIG. 2 is a schematic diagram of an application environment of a leakage eliminating circuit in accordance with a preferred embodiment of the present invention.

FIG. 2 is a schematic diagram of an application environment of a leakage eliminating circuit 3 according to the present invention. The leakage eliminating circuit 3 is disposed between a first electronic system 1 and a second electronic system 2, for eliminating leakage current when signals are transmitted from the first system 1 to the second system 2.

Figure 3:
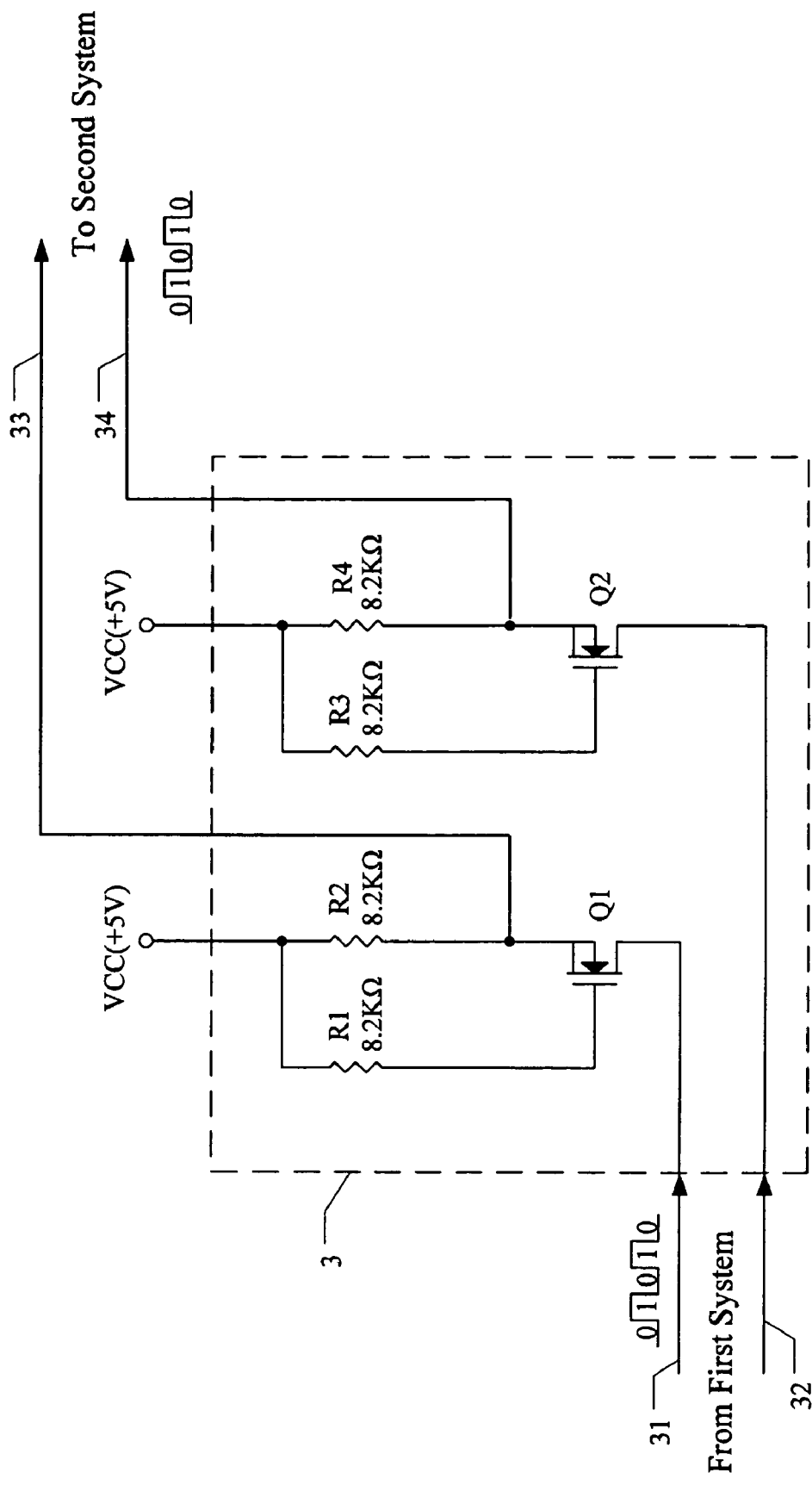
FIG. 3 is a schematic diagram of a structure and principles of the leakage eliminating circuit of FIG. 2.

FIG. 3 is schematic diagram of a structure and principles of the leakage eliminating circuit 3 of FIG. 2. In the preferred embodiment, a switching effect of a field-effect transistor (FET) is utilized for eliminating the leakage current. The FET comprises three terminals: a source, a gate, and a drain. The FET is of a kind other than a tripolar transistor. This is because a tripolar transistor is a current-controlled element, and may itself operate erroneously because of the leakage current. Preferably, the FET is a voltage-controlled element, which is not influenced by the leakage current. In the preferred embodiment, the field-effect transistor is a metallic oxide semiconductor field effect transistor (MOSFET). The number of MOSFETs employed is determined by the number of signal lines transmitting signals which are subject to leakage current. Each signal line is connected with a respective MOSFET. When the number of the signal lines is increased, the number of MOSFETs is increased accordingly. In the following descriptions, two MOSFETs designated as Q1 and Q2 are employed for eliminating leakage current in two signal lines.

One signal line 31 from the first system 1 is connected to the source of the MOSFET Q1. The signal line 31 is assumed to be subject to leakage current. The gate of the MOSFET Q1 is connected to a first VCC via a resistor R1. The drain of the MOSFET Q1 is also connected to the first VCC, via a resistor R2. Thus the MOSFET Q1, the resistor R1, the resistor R2, the first VCC and the connections therebetween form a circuit unit for eliminating leakage current. An output line 33 connects the drain of the MOSFET Q1 to the second system 2, for transmitting signals without leakage current to the second system 2. The source of the MOSFET Q2 is connected to another signal line 32 from the first system 1. The gate source of the MOSFET Q2 is connected to a second VCC via a resistor R3, and the drain of the MOSFET Q2 is connected to the second VCC via a resistor R4. The MOSFET Q2, the resistor R3, the resistor R4, the second VCC and the connections therebetween form another circuit unit for eliminating leakage current. Another output line 34 connects the drain of the MOSFET Q2 to the second system 2, for transmitting signals without leakage current to the second system 2. In the preferred embodiment, the MOSFETs Q1 and Q2 are of the 2N7002 type, the rating of each of the first and second VCCs is +5 volts, and rating of each of the resistors R1, R2, R3, R4 is 8.2 kilo-ohms (KΩ). In alternative embodiments, the ratings of the resistors can be other than 8.2 KΩ, provided that the employed FETs can be turned on and off. Further, the first and second VCCs may be replaced by a single VCC.

Hereafter, the MOSFET Q1 is used as an example for illustrating the principles of the leakage eliminating circuit 3. When a signal transmitted on the signal line 31 is at a low voltage level, the source of the MOSFET Q1 is at the low voltage level. On the other hand, because the gate of the MOSFET Q1 is connected to the first VCC (+5 volts), the gate is at a high voltage level. Therefore, the voltage from the gate to the source (VGS) of the MOSFET Q1 is more than zero. The FET is configured so that the MOSFET Q1 is turned on when the VGS is more than zero. Accordingly, the drain of the MOSFET Q1 is at the low voltage level, corresponding to the source of the MOSFET Q1. Thus, the signal transmitted to the second system 2 along the output line 33 is at the low voltage level. In contrast, when a signal transmitted from the first system 1 is at a high voltage level, the source of the MOSFET Q1 is at the high voltage level. Because of the resistor R1, the voltage level of the gate of the MOSFET Q1 is lower than that of the source of the MOSFET Q1. Thus, the VGS of the MOSFET Q1 is less than zero, and the MOSFET Q1 is turned off. The drain of the MOSFET Q1 is at the high voltage level, because it is connected to the first VCC. Thus the signal transmitted to the second system 2 along the output line 33 is at the high voltage level. The MOSFET Q2 has the same working principles as those of the MOSFET Q1. In summary, signals are transmitted to the second system 2 according to their voltage level only, and the leakage current is blocked at the MOSFETs Q1, Q2.

While a preferred embodiment of the present invention has been described above, it should be understood that it has been presented by way of example only and not by way of limitation. Thus the breadth and scope of the present invention should not be limited by the above-described exemplary embodiment, but should be defined only in accordance with the following claims and their equivalents.

What is claimed is:

1. A circuit for eliminating leakage current in signal transmission, the signal being transmitted from a first electronic system to a second electronic system, the circuit comprising at least one circuit unit for eliminating leakage current, said circuit unit comprising a field-effect transistor, a first resistor, a second resistor, an input end, an output end, and a VCC, wherein:

the input end is connected to the first electronic system for receiving a signal accompanied by leakage current;

a source of the field-effect transistor is connected to the input end, a gate of the field-effect transistor is connected to the VCC via the first resistor, and a drain of the field-effect transistor is connected to the VCC via the second resistor; and the output end connects the drain of the field-effect transistor and the second electronic system.

2. The circuit as recited in claim 1, wherein a rating of the first resistor and a rating of the second resistor are each approximately 8.2 kilo-ohms.

3. The circuit as recited in claim 1, wherein a rating of the VCC is approximately +5 volts.

4. The circuit as recited in claim 1, wherein the field-effect transistor is a metallic oxide semiconductor field effect transistor.

5. The circuit as recited in claim 1, wherein the metallic oxide semiconductor field effect transistor is a 2N7002 type.

6. A method of eliminating leakage current in signal transmission between a first electronic system and a second electronic system, comprising steps of:

disposing circuits connected between the first electronic system and the second electronic system;

providing the circuits with a field-effect transistor, a first resistor, a second resistor, an input end, an output end, and a VCC, wherein:

the input end is connected to the first electronic system for receiving a signal accompanied by leakage current;

a source port of the field-effect transistor is electrically connected to the input end, a gate port of the field-effect transistor is electrically connected to the VCC via the first resistor, and a drain port of the field-effect transistor is electrically connected to the VCC via the second resistor; and the output end connects the drain of the field-effect transistor and the second electronic system.

7. The method as recited in claim 6, wherein said first resistor and said second resistor have the substantially same value.

* * * * *